(12) United States Patent
Oishi et al.

(10) Patent No.: US 6,792,677 B1
(45) Date of Patent: Sep. 21, 2004

(54) METHOD OF MANUFACTURING AN ELECTRONIC COMPONENT UNIT

(75) Inventors: Junji Oishi, Osaka (JP); Kenichi Nagai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/195,595

(22) Filed: Nov. 18, 1998

(30) Foreign Application Priority Data

Nov. 18, 1997 (JP) .............................................. 9-316767
Mar. 30, 1998 (JP) ............................................ 10-083365

(51) Int. Cl.[7] .......................... H05K 3/32; H01L 21/60
(52) U.S. Cl. ............................ 29/840; 29/843; 29/860; 29/854; 438/119; 156/153; 228/180.1; 228/180.22
(58) Field of Search ......................... 29/840, 842, 843, 29/854, 831, 857, 860; 438/118, 119; 156/153; 228/179.1, 180.1, 180.21, 180.22

(56) References Cited

U.S. PATENT DOCUMENTS 3,762,040 A * 10/1973 Burns et al. .................. 29/593
4,767,049 A * 8/1988 Butt et al. ............ 228/179.1 X
4,817,277 A 4/1989 Hieber et al.
5,816,478 A * 10/1998 Kaskoun et al. ........ 228/180.22

FOREIGN PATENT DOCUMENTS

| EP | 0352020 | 1/1990 | |
| EP | 03-018826 | 1/1991 | |
| EP | 0811667 | 12/1997 | |
| EP | 10-112479 | 4/1998 | |
| JP | 1-166956 | * 6/1989 | .................. 156/153 |
| JP | 2-308597 | * 12/1990 | .................. 29/846 |
| JP | 08-335605 | 12/1996 | |

OTHER PUBLICATIONS

European Search Report, application No. 98121864.7, dated Apr. 12, 2000.

* cited by examiner

Primary Examiner—A. Dexter Tugbang
(74) Attorney, Agent, or Firm—RatnerPrestia

(57) ABSTRACT

A method of manufacturing an electronic component unit comprises the steps of forming a conductive pattern on a surface of a substrate, roughening a surface of a connecting area of said conductive pattern, printing an adhesive on the connecting area, connecting an electrode of an electronic component to the electroconductive adhesive on the connecting area, and drawing the adhesive at a temperature of 50–120° C.

34 Claims, 10 Drawing Sheets

METHOD OF MANUFACTURING AN
ELECTRONIC COMPONENT UNIT

FIELD OF THE INVENTION

The present invention relates to an electronic component unit which an electronic component is mounted on a substrate, and an electronic assembly using the electronic component unit, as well as a method for manufacturing the electronic component unit.

BACKGROUND OF THE INVENTION

In manufacturing an electronic component unit of the present category under discussion, a substrate is tested, before it is mounted with electronic component, with respect to conduction of electrical conductive patterns formed on the substrate. Only the substrates which passed the conduction test are sent to a subsequent process step to be mounted with electronic component.

However, some of the electronic component units are often rejected due to poor connection at the final inspection, despite the fact that such units are made with substrates approved at the above conduction test. It has been found out that the rejection is caused by the phenomena described in the following. The conductivity test of a substrate is made by contacting a piece of electroconductive rubber on the surface of connecting area of the conductive pattern. A part of the electroconductive rubber inevitably remains on the connecting area after the test. Although the electroconductive rubber as a whole has a good electrical conductivity, the remaining particle staying on the connecting area has a poor electroconductivity, or almost non-electroconductive. As a result, when an electrode of electronic component is attached on the connecting surface, the electrical connection may be deteriorated by the remaining particle staying between the surfaces. Further, in some cases, conduction troubles are brought about by an insufficient strength of connection between substrate and electronic component.

SUMMARY OF THE INVENTION

The present invention addresses the prevention of rejection due to poor electrical connection.

An invented electronic component unit comprises a substrate having a conductive pattern on at least one of the surfaces, and an electronic component mounted on the surface of the substrate, on which surface the conductive pattern has been formed; in which, the electronic component is disposed with its electrode facing to the substrate, the connecting area of the conductive pattern facing the electrode is roughened, and the electrode of electronic component is connected to the roughened surface of connecting area by means of an electroconductive adhesive.

An invented electronic assembly is structured with an electronic component unit of the present invention mounted on another substrate.

An invented method for manufacturing an electronic component unit comprises the steps of forming a conductive pattern on at least one of the surfaces of a substrate, roughening at least connecting area of the conductive pattern, and connecting the roughened surface of connecting area and electrode of electronic component by means of electroconductive adhesive.

According to the present invention, the electrical connection between electrode of electronic component and the surface of connecting area is brought to a stable state because, as a result of the roughening operation applied on the connecting area of conductive pattern, the particle of poor conductive material sticking on the surface of connecting area is removed, at the same time the surface area of connecting area is increased. Also, the roughening of the surface increases an anchoring effect of electroconductive adhesive to an enhanced mechanical connection between electrode of electronic component and connecting area of conductive pattern.

BRIEF DESCRIPTION OF THE DRAWINGS

FIG. 1 is a perspective view, FIG. 2 is a plane view, and FIG. 3 shows a cross sectional view of a key portion.

FIG. 4 is a plane view of a substrate after a conductive pattern is formed thereon, FIG. 5 is a plane view of a substrate after a glass film and a coating film are formed thereon, FIG. 6 shows a layout of through holes in a substrate as viewed from the reverse surface, FIG. 7 is a model perspective view showing a part of conductive pattern used to describe the state before sand blasting treatment, FIG. 8 is a model perspective view showing a part of conductive pattern used to describe the state after sand blasting treatment, FIG. 9 is a cross sectional view of the conductive pattern shown in FIG. 8, FIG. 10 and FIG. 11 are cross sectional views showing a roughened surface of coating film after sand blasting treatment, FIG. 12 and FIG. 13 are cross sectional views showing a roughened surface of substrate after sand blasting treatment, FIG. 14 is a process flow chart, FIG. 15 and FIG. 16 are plane views used to describe a process of surface roughening treatment, FIG. 17 is a side view used to describe a process of surface roughening treatment, FIG. 18 is a model drawing which describes an ultrasonic cleaning process.

DESCRIPTION OF THE EXEMPLARY EMBODIMENTS

Figure 1:
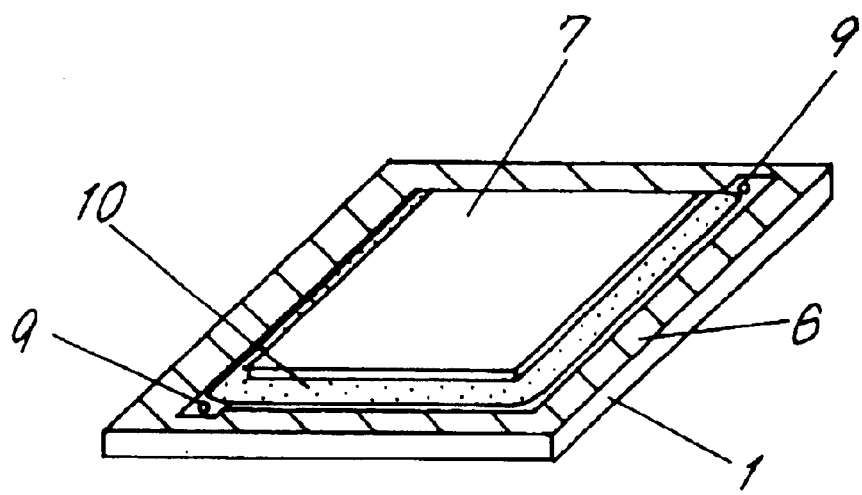
FIG. 1 to FIG. 3 show an electronic component unit in accordance with an embodiment of the present invention.

An invented electronic component unit comprises a substrate having a conductive pattern formed on at least one of the surfaces, and an electronic component mounted on the surface of the substrate on which surface the conductive pattern has been formed; in which, the electronic component is disposed with the electrode facing to the substrate, the surface of connecting area of conductive pattern facing the electrode is roughened, and the electrode of electronic component is connected to the surface of roughened area by means of an electroconductive adhesive.

An electronic component unit in accordance with an embodiment of the present invention contains a semiconductor integrated circuit (hereinafter referred to as IC) for the electronic component. The dimensions of an electrode protruding underneath an IC are very small, but the contact area has been enlarged and the anchoring effect of an electroconductive adhesive has been enhanced as a result of the roughening of the contact surface. Therefore, the protruding electrodes of IC are firmly connected to the surface of connecting area. Furthermore, the roughened surface of connecting area contributes to prevent the protruding electrode from making a sidewise sliding on the connecting surface during mounting operation of an IC. This also contributes to an increased reliability of IC mounting. As to the degree of surface roughness, it is preferred that depth of the valley (a distance between a bottom of the valley and a top thereof) is not greater than 15 μm, because of relation to the electroconductive adhesive.

In an invented electronic component unit, it is preferred that the conductive pattern is formed by a thick film printing process and the connecting surface is roughened by means of a sand blasting treatment. In the sand blasting treatment, it is easy to have a surface roughened to any desired surface condition through the control of material, grain size, etc. of abrasive and speed of colliding against the conductive pattern. There may be no risk of having a breakage in the connecting surface inviting a reduction of connecting area, because the conductive pattern has been formed through a thick film printing process. Contrary, even if there is an extruding portion in a part, in the central portion for example, of the connecting area of conductive pattern, it may be flattened by the sand blasting treatment and the entire area may be made substantially flat. This eventually makes it easy to connect an electrode of electronic component to the connecting area. It is also preferred to form the connecting area by thick film printing so that the outer circumference is expanding outward. By so doing, the surface of connecting area becomes larger and the strength of connection by means of electroconductive adhesive may be made still higher.

It is preferred that the conductive pattern is formed by a thick film printing process, and its surface of connecting area is roughened by means of dry etching process. In the dry etching process, the connecting surface may be roughened to any desired state through control of the power of electric output.

It is preferred that the surface excluding the connecting area of conductive pattern is covered by a glass film having roughened surface. When a substrate is covered by a glass film in the surface excluding the connecting area, a conductive pattern may be held firmly to the substrate and would not peel off easily. The glass film also contributes to prevent the short-circuiting between adjacent conductive patterns. Furthermore, when a substrate which is mounted with an electronic component is covered with a sealing resin, the sealing resin may proceed along the roughened portion of the glass film to play an anchoring role for an increased sealing strength of the resin. The resin permeates into also underneath the electronic component through a capillary channel provided by the roughened surface of glass film. The resin functions also as an adhesive to connect the electronic component with the substrate. Thus the connecting strength is further enhanced.

It is also preferred that a mark for position sensing having a roughened surface is provided on the substrate in an area void of glass film. When a position sensing by means of an optical procedure is introduced, the accuracy of position sensing may be increased because the reflection at the surface of position mark is lessened by the roughened surface.

It is preferred that a connecting electrode is provided on the reverse surface, the surface on which no conductive pattern exists, of a substrate and the connecting electrode is electrically coupled via a through hole provided in the substrate with a conductive pattern formed on the front surface of the substrate. With a substrate of the above construction, it is easy to mount it on and connect it with other substrate of larger size or such other substance, because of the connecting electrode which is disposed on a reverse surface of substrate, a surface free of any electronic component. Namely, because the front surface is mounted with electronic components there is a limitation in securing an appropriate space for the connecting electrode on a front surface; whereas it is easier to provide a connecting electrode on the reverse surface at, for example, the circumferential portion where connecting operation may be made easily. Further, provision of a glass film on the reverse surface covering an area other than the connecting electrode is effective for preventing a substrate from causing a thermal deformation. This facilitates the easy connection with said other substrate of larger size.

It is preferred that the surface of a substrate is roughened in an area not covered by a conductive pattern. When applying a glass film or a sealing resin on a surface excluding the connecting area of conductive pattern, the strength of adhesion to the substrate is enhanced by the roughened surface. The roughening treatments on the substrate surface and the connecting area of conductive pattern may be performed simultaneously by a single operation of roughening treatment. Thus a separate operation for the roughening treatment may be eliminated to an improved operational efficiency.

It is preferred that a gap between an electronic component and a substrate is filled with a sealing resin. The electronic component may be held firmer to the substrate with the sealing resin. Moreover, the anchoring effect of sealing resin may be enhanced by the roughened surface of substrate to a higher adhesive strength.

It is preferred that the surface of outer circumferential area of a substrate is roughened by means of sand blasting treatment. The roughening treatment eliminates cracks staying at the outer circumferential surface of a substrate; as a result, the occurrence of broken substrate during subsequent manufacturing process steps may be suppressed. Namely, a substrate is provided out of a large-size substrate having splitting grooves formed thereon, which substrate is split into pieces of a substrate. Each of the split substrate mostly bears cracks in the outer circumferential surface. The crack is liable to induce a broken substrate in subsequent manufacturing steps. The removal of cracks by means of sand blasting treatment is effective to curtail the occurrence of broken substrate.

An invented electronic assembly comprises said electronic component unit consisted of an electronic component mounted on a first substrate, which unit being mounted on a second substrate. As the electronic assembly employs an electronic component unit in which an electronic component has been mounted firmly on the first substrate in accordance with the present invention, a significantly high reliability may be expected with such electronic assembly. In a case where the electronic component to be mounted in the unit is a functional circuit consisted of hybrid electronic components including an IC, the functional circuit may be realized in a small volume, which contributes to making an electronic assembly even smaller.

The invented method for manufacturing an electronic component unit comprises the steps of forming a conductive pattern on at least one of the surfaces of a substrate, roughening at least the surface connecting area of the conductive pattern, and connecting the roughened surface and an electrode of electronic component by means of electroconductive adhesive.

According to an embodiment of the invented manufacturing method for an electronic component unit, a conductive pattern is first formed, the conductive pattern is tested in the conductivity by having a contact with an electroconductive rubber piece for conduction test at the surface of a contacting area of the conductive pattern, and then the surface of contacting area is roughened. By the roughening treatment applied on the connecting area, residual particles of the electroconductive rubber piece left on the surface of connecting area after the conductivity test are removed. Therefore, an electrode may be connected with the connecting area in good electrical and mechanical conditions.

In an invented manufacturing method for an electronic component unit, it is preferred that a conductive pattern is formed through a thick film printing process, and the surface of connecting area of the conductive pattern is roughened by means of sand blasting treatment. With the sand blasting treatment, control on the grade of surface roughening is easy, and any desired rough surface may be provided. The surface of connecting area may also be roughened by means of dry etching treatment. In this treatment, a desired rough surface may be obtained through an appropriate output control.

It is preferred to provide a process for covering a surface with a glass film excluding the connecting area, and to roughen the surface of glass film at a same process step for roughening the connecting area. It is also preferred that the substrate surface bearing a conductive pattern is roughened in a same process step for roughening the connecting area. It is also preferred that a mark for location detection is formed on the surface of a substrate in a same process step for forming a conductive pattern, and the surface of the mark for location detection is roughened in a same process step for roughening the connecting area. The operational efficiency may be increased by performing the roughening treatment on any desired surface in a same process step for roughening the surface of connecting area.

It is preferred that, after electrode of an electronic component is connected to the connecting area of conductive pattern, the gap between the electronic component and the substrate is filled with a seating resin. As the surface of substrate has been roughened, the electronic component may be fixed firmer on the substrate by sealing resin.

It is preferred that the outer circumferential surface of a substrate is roughened in a same process step for roughening the surface of connecting area. By the roughening treatment on the outer circumferential surface, occurrence of cracks at the outer circumferential portion of a substrate may be curtailed.

In an invented manufacturing method, an individual substrate may be obtained out of a larger-sized substrate having grooves for separation thereon, by separating it along the grooves. The above procedure provides a plurality of substrates easily.

In roughening the surface, it is preferred to dispose a plurality of substrates on a plate in a straight line arrangement making a sort of substrates cluster, and then to blast abrasives from a nozzle against the substrates after regulating the position of the substrates cluster at both ends in the length direction with a guide member. By so doing, a plurality of substrates can be roughened in the surface at one time.

In the roughening treatment, it is also preferred that a substrate is stuck on a plate with a tape, and then the substrate is blasted with abrasives coming from a nozzle. In the above method, a substrate stuck on the plate is not swayed by the abrasive blasted from a nozzle; as a result, the portion of substrate connecting with a conductive pattern as well as the outer circumferential surface of substrate can be surely roughened. If the width of the tape is made to be smaller than that of the substrate, the outer circumferential portion of a substrate is left as a surface free from sticking on the plate; in this state, the outer circumferential portion may be roughened in an easier manner by the abrasives blasted from a nozzle. After the roughening treatment is finished, the substrate may be peeled off the plate easily from the portion free from the sticking. Further, a plurality of substrates may be stuck on a tape having a certain length providing a certain clearance between each other; by so doing, a plurality of substrates may be roughened at one time to an improved operating efficiency. By virtue of the clearance provided between the substrates, each of the substrates may be roughened surely at the circumferential portion.

Also preferred is to use a tape whose outer diameter is smaller than that of a substrate, in sticking a substrate on a plate for the roughening treatment. By so doing, the entire outer circumferential portion of a substrate is left as the surface free from sticking. Thus the entire outer circumferential portion of a substrate may be roughened with ease by abrasives blasted from a nozzle.

It is preferred that a plurality of substrates are disposed on a plate with a certain clearance between each other, and the substrates are roughened by blasting abrasives thereon from a nozzle. By moving the nozzle in a sweep action, each of the substrates may be roughened substantially even. Furthermore, as a sufficient amount of abrasives is blasted from a nozzle to each of the substrates according to the present method, a conductive pattern formed in an unstable state may be blasted away during the roughening treatment. This means the prevention of a possible rejection that might arise in a subsequent process step. In the present method, it is also preferred that a nozzle sweeps in a rectangular wave form. By so doing, a small nozzle can perform a more even roughening treatment on substrates. By sweeping a nozzle for plural times, the roughening treatment on substrates may become sufficient and more even. It is also preferred that a nozzle takes in a second sweep a track that is different from that in a first sweep. By so doing, the surface of substrates disposed on a plate may be roughened more homogeneously even if the pattern of abrasives blasted from a nozzle was not uniform.

In the surface roughening treatment by means of nozzle sweeping, it is preferred that a nozzle sweeps in both ways after a rectangular waveform. By making a nozzle sweep in both ways, a plurality of substrates disposed on a plate may be roughened more homogeneously with a small nozzle. Further, by making a nozzle sweep after different tracks respectively in going and returning, the substrates may be roughened more homogeneously even if the pattern of abrasives blasted from a nozzle was not uniform.

In a roughening treatment using a nozzle, it is also preferred to employ a nozzle whose width of opening is larger than the width of substrate. Because of the nozzle width larger than the substrate width, the entire surface of substrate may be roughened with one operation providing a homogeneous rough surface. It is also preferred that after a plate is swept by a nozzle the plate is rotated to be swept once again by the nozzle. By so doing, the state of roughened surface resembles to that roughened by sweepings conducted in different directions. This helps make the roughened surface more homogeneous. When the rotation angle of plate is set at approximately 90 degrees, the surface of each substrate attached on a plate is roughened from two different directions perpendicular to each other. This helps make the roughened surface more homogeneous.

In a roughening treatment using a nozzle, it is also preferred to first blast abrasives of larger grain size and then blast abrasives of smaller grain size for roughening the substrate surface. The blasting of abrasives of larger grain size wildly roughens the surface of a substrate, and an imperfect conductive pattern, if there is, may be broken to the prevention of rejects that might arise in a subsequent process step. And then, as the wildly roughened surface is re-treated with abrasives of smaller grain size, there is no difficulty in mounting an electronic component on the substrate.

In a roughening treatment using a nozzle, it is also preferred to reverse the plate upside down so as the substrate is disposed on the lower surface of the plate, blasting abrasives upward against the substrate from a nozzle provided underneath. The abrasives and chip dusts fall downward and it is difficult for to stay on the surface of substrate after the roughening treatment. The occurrence of troubles in the connection between electrode of an electronic component and the surface of connecting area due to such residuals staying in the surface may be curtailed. Volume of the residuals, if there is, may be very small; which means that only a simple treatment might be required in the subsequent stages for removal of such residuals.

In a roughening treatment using a nozzle, it is also preferred to blow a gas to the surface of substrate roughened by the blasting of abrasives. By so doing, the abrasives and chip dusts staying on a substrate may be blown away, and the occurrence of connection trouble due to such residuals may be curtailed.

In a surface roughening treatment of a substrate, it is preferred to clean a roughened substrate by means of ultrasonic cleaning in a liquid containing no oxygen. As the ultrasonic cleaning removes abrasives and chip dusts from the substrate the connection troubles due to residuals may be prevented. As the liquid used contains no oxygen the ultrasonic cleaning does not cause any connection trouble due to oxidization of connecting surface. Alcohol is preferred for the liquid of ultrasonic cleaning. Alcohol is advantageous in that it does not oxidize the surface of connecting area of conductive pattern, and it easily dries up after cleaning.

In an ultrasonic cleaning process, it is preferred to house a plurality of substrates in a container in the upright position and immerse the substrates altogether in the container into liquid. By so doing, a plurality of substrates can be cleaned at once, and is efficiently cleaned because they are standing upright and the abrasives and chip dusts fall beneath the level of substrate. It is also preferred to provide an individual space in the container for housing each of the substrates, allowing each substrate to flutter freely within the space. By so doing, substrate flutters during ultrasonic cleaning and an improved cleaning effect may be obtained.

In an ultrasonic cleaning process, it is preferred to blow substrates, after being pulled out of liquid, with a gas containing least oxygen. By the gas blowing, the substrate dries quickly, and the abrasives and chip dusts returned onto the surface of substrate may be removed effectively. The connection trouble due to oxidation of connecting surface may not be induced as the gas contains least oxygen. Further, it is preferred that substrates after gas blowing are stored in an ambient free from the atmospheric air. By so doing, the connecting area of conductive pattern may be prevented from getting oxidized, which contributes to eliminating the rejects due to poor connection with electrode of an electronic component that might arise in a subsequent process step.

Now in the following, a preferred exemplary embodiment of the present invention is described with reference to the drawings.

Figure 2:
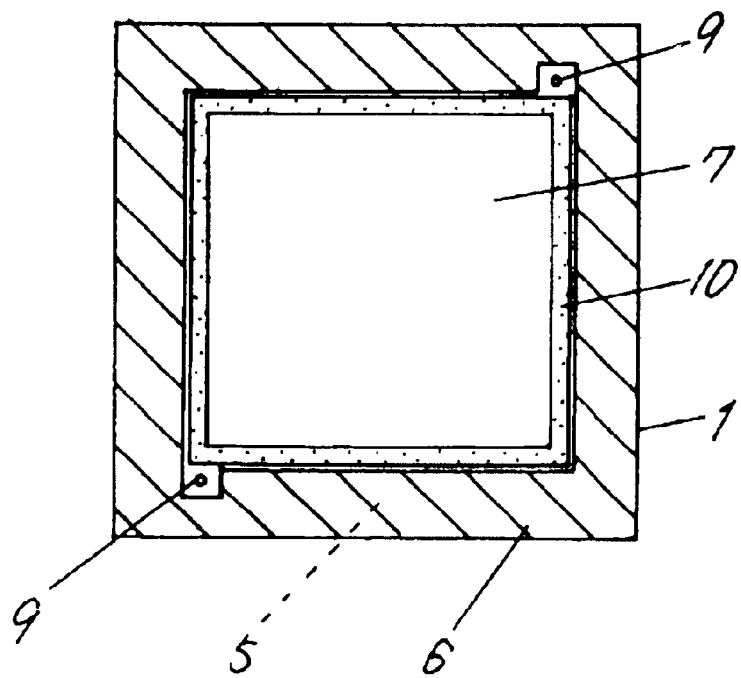
Figure 3:
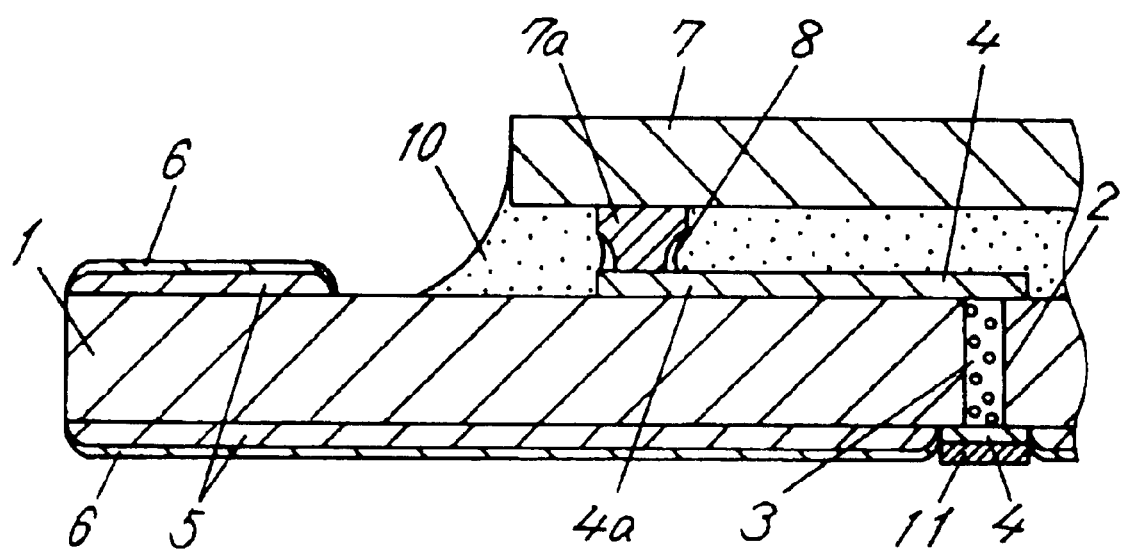
Figure 4:
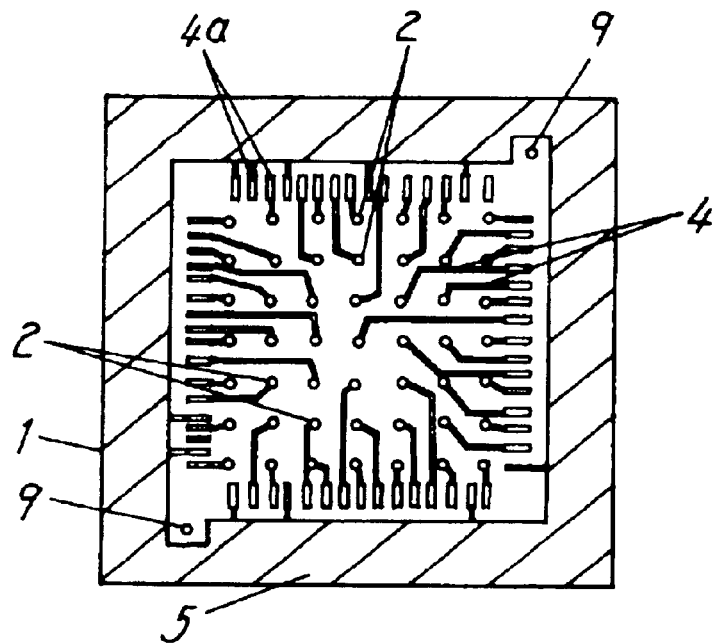
FIG. 4 to FIG. 18 are used to describe a method for manufacturing an electronic component unit in accordance with an embodiment of the present invention.
Figure 6:
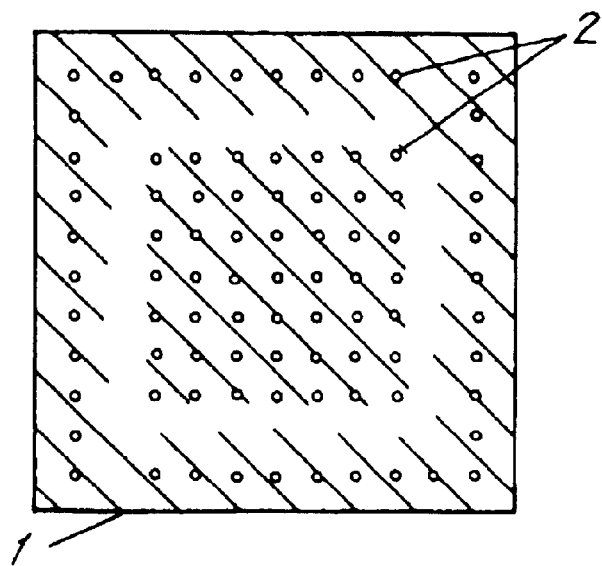

An electronic component unit as shown in FIG. 1 to FIG. 3 is manufactured through the following process steps. In the first place, a substrate 1 made of alumina sheet is provided, in which sheet a plurality of through holes 2 has been disposed, as shown in FIG. 4 and FIG. 6. The through holes 2 are filled with an electroconductive material 3, such as AgPd, as shown in FIG. 3 (Process step A of FIG. 14).

On a front surface of substrate 1, a line shape conductive pattern 4 (FIG. 3, FIG. 4) which is connected with the electroconductive material 3, and on a reverse surface a round shape conductive pattern 4 (FIG. 3) connected with the electroconductive material 3, respectively, are formed by a thick film printing process (Process step B of FIG. 4). The conductive pattern 4 is comprised of an AgPd paste or an Ag paste. In the process step at which the conductive pattern 4 is formed, a mark 9 for location detection is also printed at two places on a diagonal of the substrate 1. And then, the conductive pattern 4 is baked (Process step C of FIG. 14).

On the front surface of circumferential area of substrate 1, an insulating glass film 5. (FIG. 3, FIG. 5) is printed in a frame shape, and an insulating glass film 5 of square shape in the inner part (FIG. 5); on the reverse surface of substrate 1, an insulating glass film 5 (FIG. 3) is printed over substantially the whole surface excluding the conductive pattern 4 (Process step D of FIG. 14). The insulating glass film 5 is comprised of a crystallized glass. The insulating glass film 5 thus formed is effective to avoid the humidity sneaking into substrate 1, and the occurrence of migration with the conductive pattern 4 is also suppressed. The insulating glass film 5 is baked at a temperature 850° C. (Process step E of FIG. 14).

Figure 14:
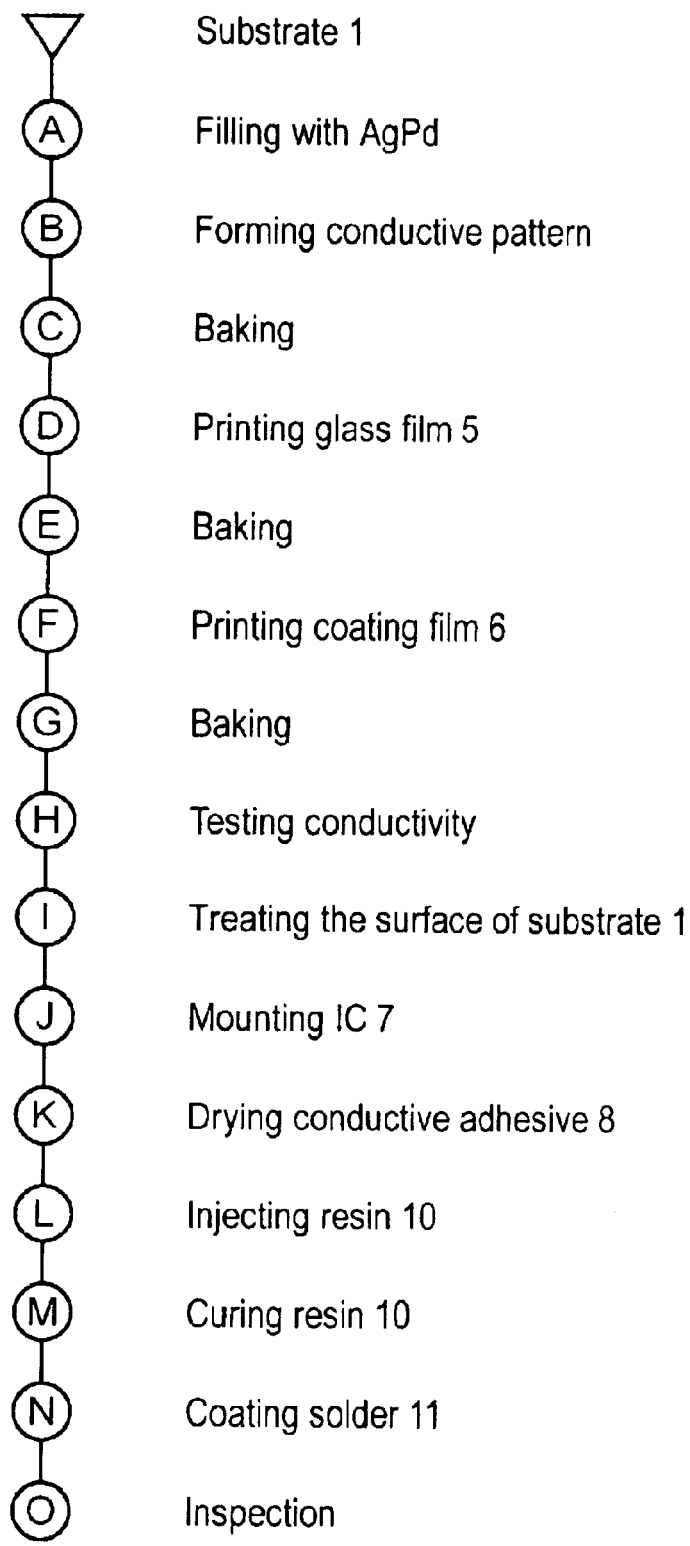

In order to further increase the anti-humidity property, a coating film 6 (FIG. 1–FIG. 3, FIG. 5) comprised of an amorphous glass is formed by means of printing process (Process step F of FIG. 14). The coating film 6 is baked at a temperature 600° C. (Process step G of FIG. 14). Through the above described process steps, a substrate 1 is provided, on which surface the connecting areas 4a of conductive pattern 4 are exposed intermittently in a frame shape region.

Figure 5:
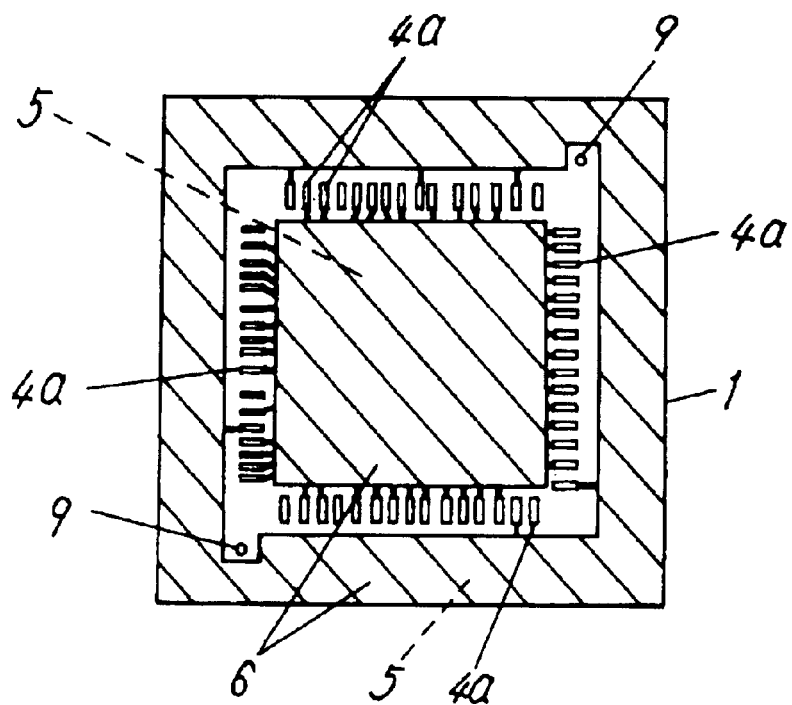

An electroconductive rubber piece (not shown) is pressed to the front surface of substrate 1, and a conductivity test electrode (not shown) is placed to touch on the round conductive pattern 4 formed on the rear surface of the substrate 1, for performing a conductivity test (Process step H of FIG. 14). As shown in FIG. 5, a plurality of connecting areas 4a for connection with electrodes of an electronic component is disposed in the proximity with a small clearance to each other over the front surface of substrate 1. It is quite difficult to make each of the contacting areas 4a touch with a conductivity test electrode. Therefore, all the contacting areas 4a are short-circuited by pressing an electroconductive rubber piece on the surface.

On the reverse surface, a round conductive pattern 4 coupled with the connecting area 4a via electroconductive material 3 is provided as shown in FIG. 3. The round conductive patterns 4 are placed scattered over the substrate 1, as shown in FIG. 6, with sufficient distance from adjacent ones. So, a conductivity test electrode may easily come into contact with the conductive pattern. The conductivity between the connecting area 4a on the front surface and the round conductive pattern 4 on the reverse surface may be tested by confirming the conductivity between two conductive patterns on the reverse surface. As soon as the conductivity test is finished, the electroconductive rubber piece provided on the front surface of substrate 1 and the conductivity test electrode placed on the reverse surface are removed.

Figure 7:
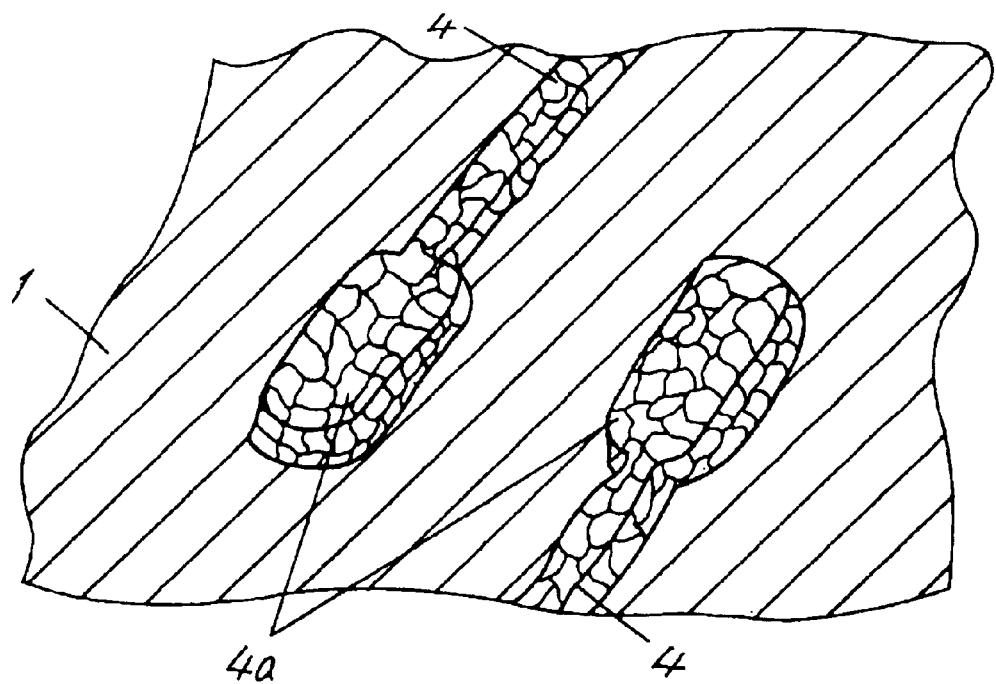
Figure 8:
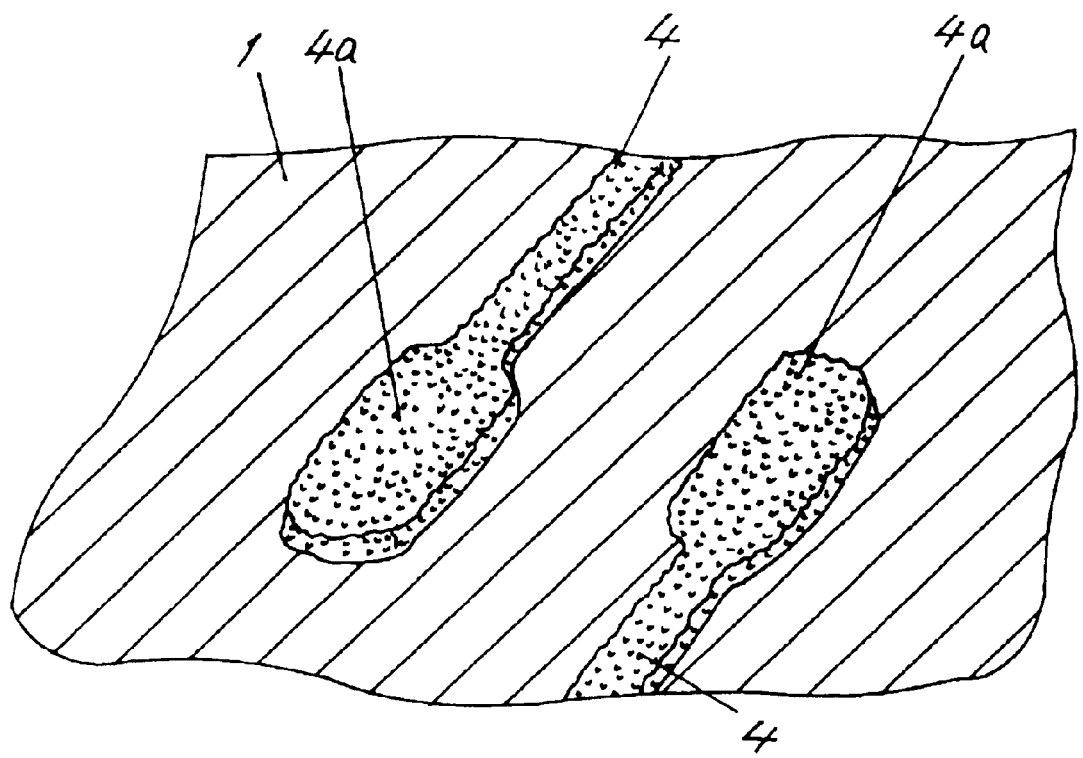
Figure 9:
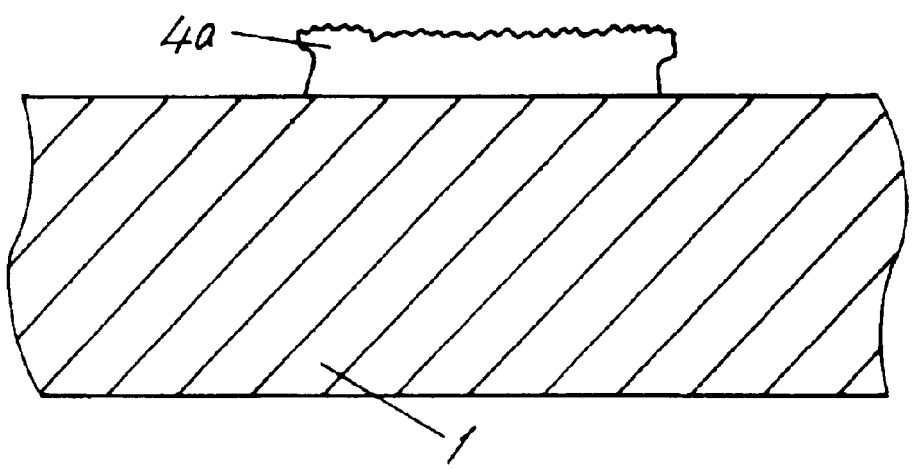

Then, the front surface of substrate 1 undergoes a sand blasting treatment with SiC powder of 5–7 μm grain diameter (Process step I of FIG. 14). This treatment is effective with respect to the following function. Namely, a small portion of the electroconductive rubber piece which was pressed to the connecting area 4a, on which surface a protruding electrode 7a of IC 7 is to be connected in a subsequent process step, at the conductivity test inevitably remains sticking on the connecting area 4a. As the small portion sticking on the connecting area is hardly elctroconductive, a conductivity trouble may arise between the surface of connecting area 4a and the protruding electrode 7a when IC 7 is mounted the substrate. This is the reason-why the sticking portion has to be removed. The conductive pattern 4 before sand blasting treatment, as shown in FIG. 7, is roughened in the surface by the sand blasting to a state as shown in FIG. 8 and FIG. 9. When, the portion sticking on the surface of connecting area 4a is removed; as a result, the conductivity trouble between said connecting area 4a and protruding electrode 7a may be eliminated.

The surface roughening treatment is effective also to enhance the connecting strength between connecting area 4a and IC 7. Although the dimensions of protruding electrode 7a locating under IC 7 is quite small, the surface roughening treatment applied on the corresponding connecting area 4a of conductive pattern 4 brings about an increased connecting surface area and an enhanced anchoring effect by the electroconductive adhesive 8. By virtue of the above factors, the protruding electrode 7a is connected firmly with the connecting area 4a. Furthermore, the roughened surface of connecting area 4a contributes to prevent the protruding electrode 7a from moving sidewise on the connecting surface 4a during mounting operation of IC 7. Thus the reliability in mounting is also improved.

As to the degree of surface roughness, it is preferred that depth of the valley (a distance between a bottom of the valley and a top thereof) is not greater than 15 μm. The preferable thickness of the electroconductive adhesive 8 is approximately 15 μm. If the depth of the valley is greater than 15 μm, the electroconductive adhesive 8 may be mostly absorbed in the valley when volume of the adhesive 8 is small. This might cause an insufficient connecting strength between the protruding electrode 7a and the connecting area 4a.

The conductive pattern 4 of the present exemplary embodiment has been formed by a thick film printing process. Therefore, it is easy to have the surface of connecting area 4a roughened to any desired surface condition through the control of material, grain size, etc. of abrasive and the speed of colliding against the surface of conductive pattern 4 during sand blasting treatment. There may be no risk of having a breakage in the connecting area 4a inviting a reduction of connecting surface area; contrary, even if a part of the connecting area 4a, for example, its central portion, had been formed protruded during the printing the sand blasting pushes the protrusion down to make the entire area substantially flat, as shown in FIG. 9. This eventually facilitates the connection of the protruding electrode 7a of IC 7 to the connecting area 4a. If the sand blasting is further continued after the area is flattened, the outer circumference of the connecting area 4a stretches outward. This means an increased surface area of the connecting area 4a, and the increase may enhance the connecting strength with the protruding electrode 7a by means of electroconductive adhesive 8.

For the purpose of simply roughening the surface of connecting area 4a formed by a thick film printing process, a dry etching process may be employed.

When the sand blasting treatment is used, the exposed surface of conductive pattern 4, the surface of coating film 6, the exposed surface of substrate 1 on which the connecting area 4a is disposed, and the surface of a mark 9 for location detection formed at a same process step for forming the conductive pattern 4, shown in FIG. 3 and FIG. 5, may be roughened too, in addition to the surface of connecting area 4a. In a case where the detection of location of substrate 1 is made by an optical system when mounting an IC 7, the roughened surface of mark 9 reflects less light, which contributes to an increased accuracy of location sensing. Thus the IC 7 may be rightly mounted on substrate 1.

IC 7 is mounted on the substrate by first printing the electroconductive adhesive 8 on the surface of connecting area 4a, and then bringing the protruding electrode 7a to make contact with the surface of connecting area 4a (Process step J of FIG. 14). The electroconductive adhesive 8 is then dried at a temperature 50–120° C. (Process step K of FIG. 14).

Figure 10:
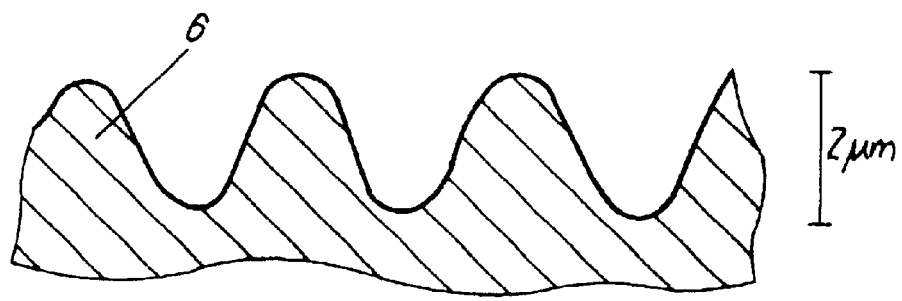
Figure 11:
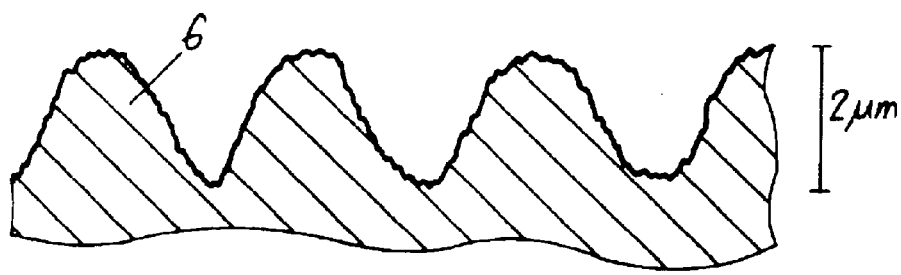
Figure 12:
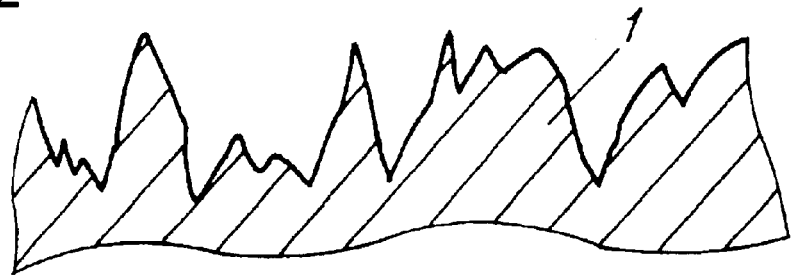
Figure 13:

And then, a sealing resin 10 (FIG. 3) is injected between the substrate 1 and the IC 7 (Process step L of FIG. 14). The sealing resin 10 is cured at a temperature 120–150° C. (Process step M of FIG. 14). The surface of coating film 6 (FIG. 5) locating underneath the IC 7 has already been roughened by sand blasting treatment, as shown in FIG. 10 and FIG. 11, when the sealing resin 10 is injected. The roughened surface provides a sort of capillary to help the sealing resin 10 go into a gap between IC 7 and substrate 1. The interlocating sealing resin 10 plays a role of anchoring the IC 7 firmly onto the roughened surface of coating film 6, in the succeeding step of curing. The circumferential area of substrate 1 outside the IC 7 has also been roughened by sand blasting treatment, as shown in FIG. 12 and FIG. 13; therefore, the adhesion strength of sealing resin 10 with the circumferential area is also increased by the anchoring effect.

After mounting of IC 7 and sealing with sealing resin 10 are finished, the surface of round conductive pattern 4 formed on the reverse surface of substrate 1 is coated with a solder 11 as shown in FIG. 3 (Process step N of FIG. 14). Finally, inspection of an electronic component unit is conducted by having an inspection probe (not shown) to make contact with the solder 11 (Process step 0 of FIG. 14).

Figure 15:
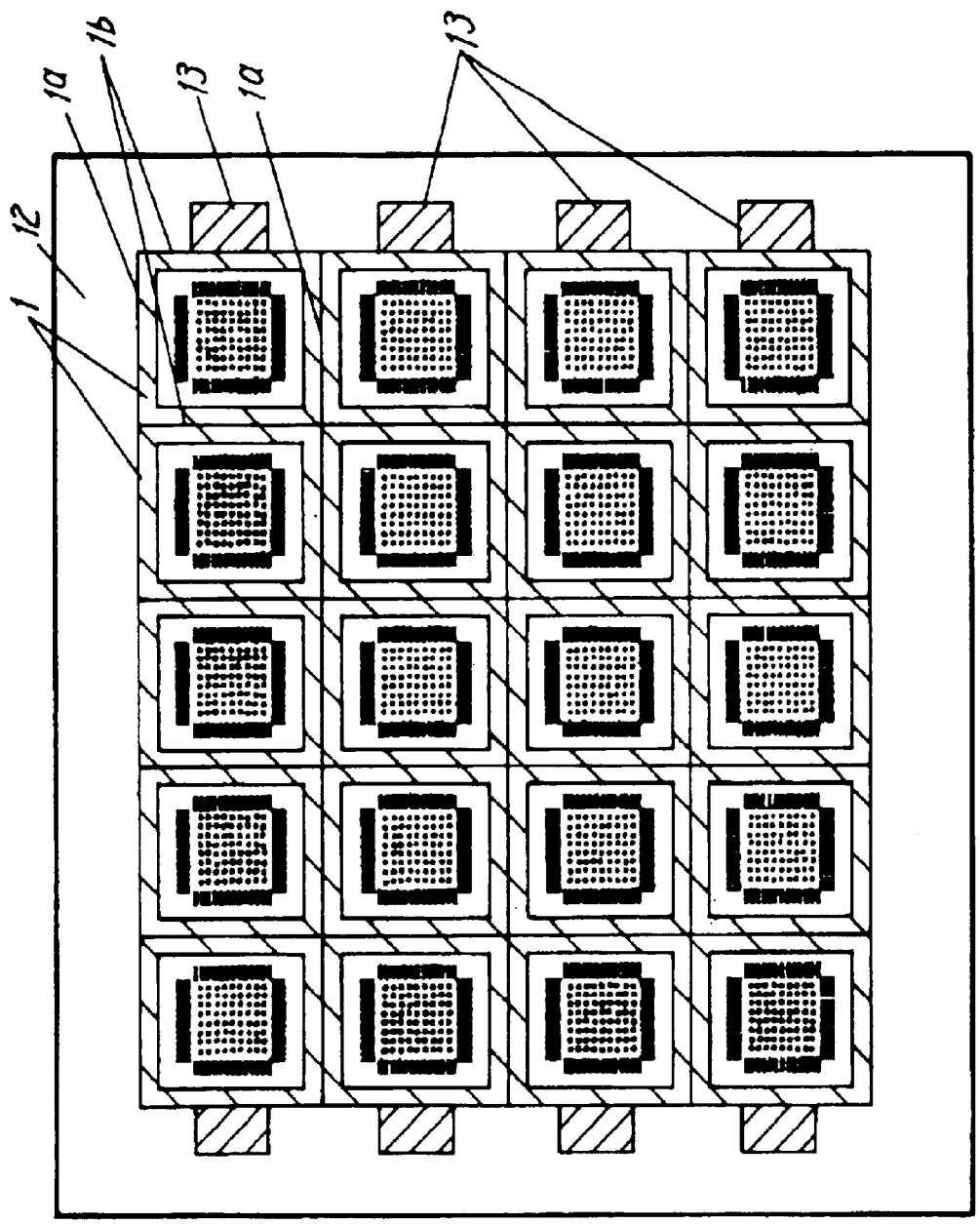
Figure 16:
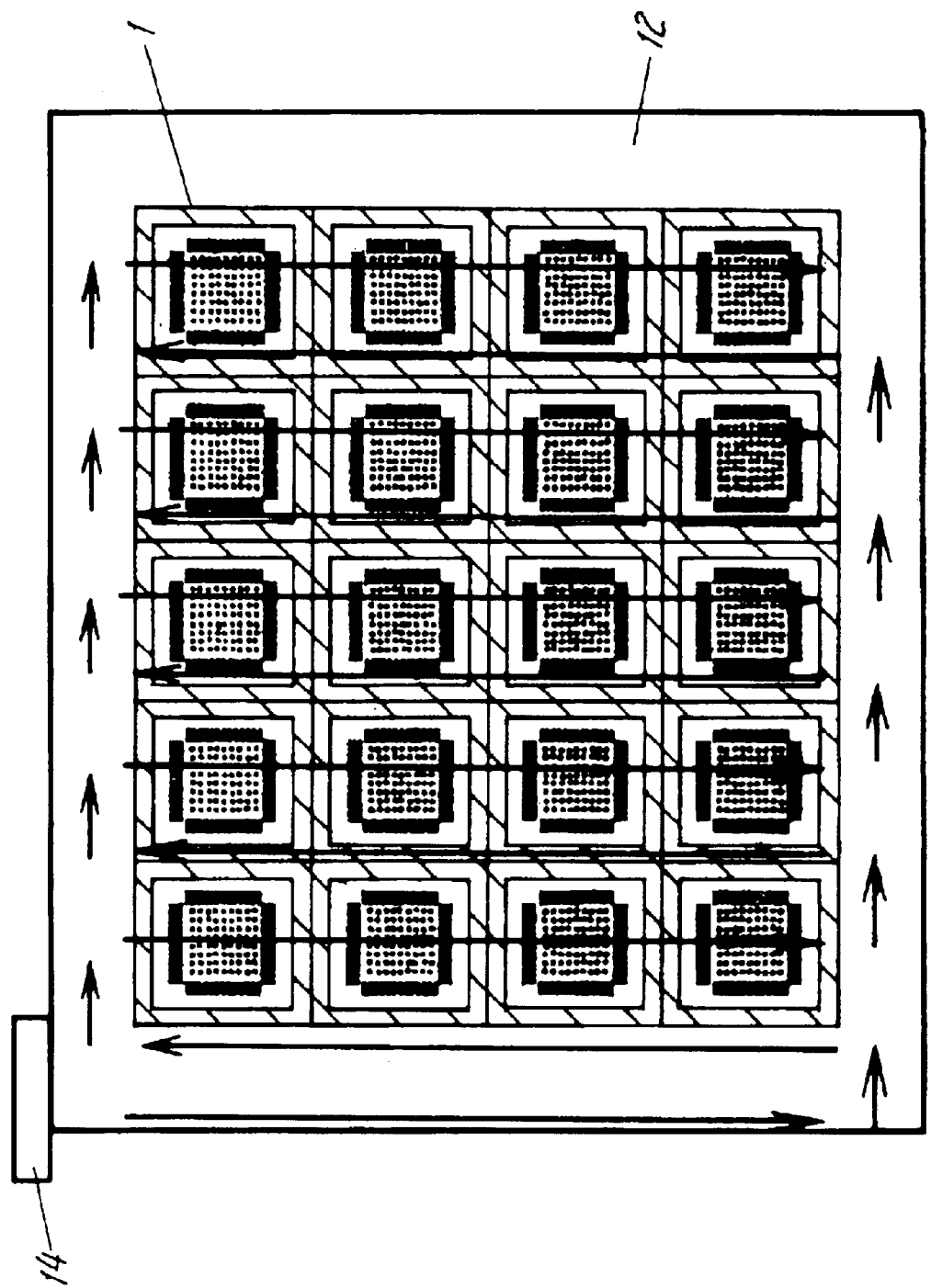

The sand blasting treatment is described more in detail in the following with reference to FIG. 15 and FIG. 16. In the first place, a plurality of substrates 1 is stuck on a plate 12 made of a metal or a ceramic using a double-faced adhesive tape 13 of a certain length as shown in FIG. 15, and then the roughening treatment is performed by blasting the abrasives along a direction of the length direction of tape 13 from a nozzle 14 against the substrates 1, as shown in FIG. 16. The substrates 1 stuck on the plate 12 are not swayed by the abrasives blasted from nozzle 14; therefore, the surface of connecting area 4a of a conductive pattern 14 on the substrate 1 and the surface of outer circumferential area of the substrate 1 may be surely roughened.

Each of the substrates 1 shown in FIG. 15 and FIG. 16 has been provided out of a large-size substrate having splitting grooves formed thereon, which substrate is split along the grooves into pieces of individual substrate 1. A number of substrates 1 may be easily available in this way from a large-size substrate. However, a substrate 1 manufactured through the above procedure often bears a crack in the outer circumferential portion, which crack having been generated at the time when it was separated from the large-size substrate. The crack in the circumferential portion is liable to grow into a broken substrate 1 in the subsequent manufacturing steps. In the present exemplary embodiment, the crack is removed in advance by blasting abrasives from nozzle 14 to prevent occurrence of the broken substrate 1. The operating efficiency has been raised by performing the roughening treatments on the outer circumferential surface of substrate 1 and on the surface of connecting area 4a at a same time, in the present exemplary embodiment.

The nozzle 14 sweeps over the plate 12 after a rectangular waveform, as shown in FIG. 16. The sweeping motion enables a small nozzle 14 to perform a substantially homogeneous roughening treatment on the plurality of substrates 1 disposed on plate 12. By making the nozzle 14 sweep go and return for plural times the surface roughening may be applied more homogeneously on the substrates. If the nozzle 14 is made to take in a second sweep a track that is different from that in a first sweep, the surface of plurality of substrates 1 disposed on plate 12 may be roughened sufficiently homogeneous even if the pattern of abrasives blasted from nozzle 14 was not uniform.

As the width of double-faced adhesive tape 13 is smaller than that of each substrate 1, as shown in FIG. 15, a pair of sides 1a, among the total sides, of substrate 1 remains as the surface free of sticking. Therefore, the portion of the pair of sides 1a may easily be roughened by the abrasives blasted from nozzle 14. After the roughening treatment is over, the substrate 1 may be peeled off the plate 12 easily from the portion free of sticking. Although in FIG. 15 it appears as if substrate 1 in the first column and that in the second column, substrate 1 in the second column and that in the third column, and substrate 1 in the third column and that in the fourth column, are respectively disposed side by side making contact to each other at the side 1a; actually, however, a certain gap is provided between each of the adjacent sides 1a that is sufficient to allow the abrasives blasted from nozzle 14 going through. Therefore, the side 1a of substrate 1 at each column may receive the roughening treatment sufficiently. If the other pair of sides 1b of substrate 1 are also to be roughened efficiently, the plurality of substrates 1 may be disposed on the double-faced adhesive tape 13 providing a certain specific clearance between the substrates in the length direction of the tape. Through the clearance provided between the sides 1b of adjacent substrates 1, enough abrasives blasted from nozzle 14 can reach the portion of side 1b for conducting a sufficient roughening treatment.

Even when the substrates 1 are disposed with a certain clearance provided between the adjacent ones at both the side 1a and the side 1b, the roughening treatment at the side 1b may remain insufficient because the middle part of side 1b is stuck on plate 12 with the double faced adhesive tape 13. In order to avoid the above insufficiency of roughening treatment, each of the substrates 1 may be stuck on plate 12 with a tape 13 of reduced size whose outer diameter is smaller than that of individual substrate 1. By so doing, the entire outer circumferential portion (side 1a and side 1b) of a substrate 1 is left as the surface that is free of sticking, and the entire outer circumferential portion of each substrate 1 may receive the roughening treatment with ease by abrasives blasted from nozzle 14.

Now in the following, other preferred methods for roughening the surface of a substrate are described. One of the methods is to rotate the plate 12 for approximately 90 degrees after the plate 12 is swept once by the nozzle 14, and then the plate 12 is swept again by the nozzle 14. By so doing, the state of roughened surface of substrate 1 becomes resembled to that roughened by nozzle from both one direction (for example, X direction) and the other direction (Y direction). In this way a surface may be roughened more homogeneously.

It is also preferred to employ a nozzle 14 whose width of opening is larger than the width of substrate 1. Each of the substrates 1 may be roughened at each time for the entire surface. Thus a more homogeneous roughened surface may be obtained.

It is also preferred to first blast abrasives of larger grain size on substrate 1 from nozzle 14, and then blast abrasives of smaller grain size in the roughening treatment. The blasting of larger grain-size abrasives may roughen the surface of substrate 1 wildly, and break an imperfect conductive pattern 4 in advance for the prevention of possible rejects that might arise in the subsequent process steps. And the retreatment with the smaller grain-size abrasives eliminates any difficulty in mounting an electronic component on substrate 1.

So far, the descriptions have been made based on the methods where the substrates 1 are stuck on a plate 12 by means of double-faced adhesive tape 13. However, the substrates 1 may also be fixed on a plate 12 by disposing a plurality of substrates 1 on a plate 12 in a straight line arrangement providing a sort of substrates cluster, and then abrasives from nozzle 14 may be blasted against the substrates 1 after regulating the positioning of the substrates cluster at both ends in the length direction with a guide member. By so doing, the surface of a plurality of substrates may receive the roughening treatment at one time.

Figure 17:
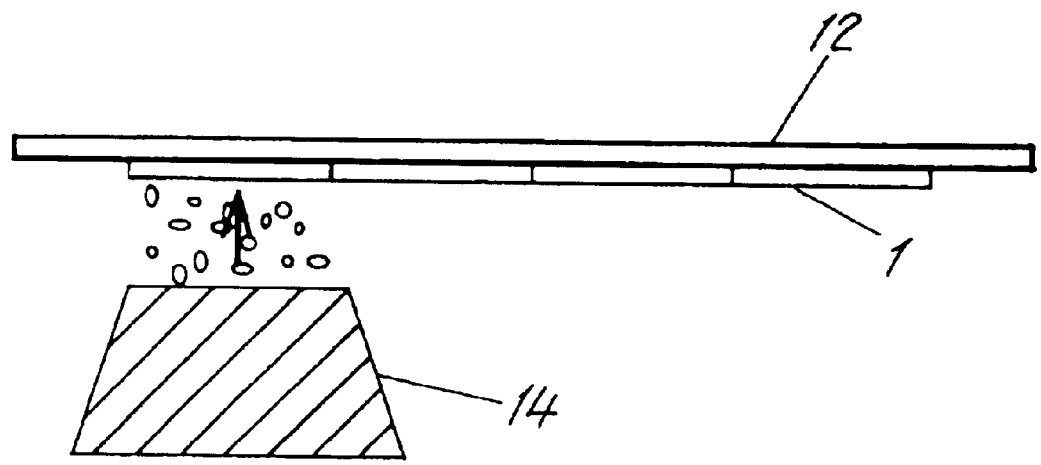

The abrasives may be blasted from under the substrate 1 by nozzle 14, as shown in FIG. 17. Namely, the plate 12 is reversed upside down so as the substrate 1 comes under the plate 12, and the nozzle 14 located under the substrate 1 blasts abrasives upward against the substrate 1. The abrasives and chip dusts of roughening fall downward, so it may be difficult for them to stay on the surface of substrate 1. As a result, occurrence of the connection rejects due to residuals staying between connecting area 4a and protruding electrode 7a may be suppressed.

It is preferred that the surface of substrate 1, after being roughened by abrasives blasted from nozzle 14, is blown with a gas containing least oxygen. As the abrasives and chip dusts remaining after the roughening treatment are blown away from the substrate 1 by the gas, the occurrence of connection trouble between connecting area 4a and protruding electrode 7a due to such residuals may be suppressed.

Figure 18:
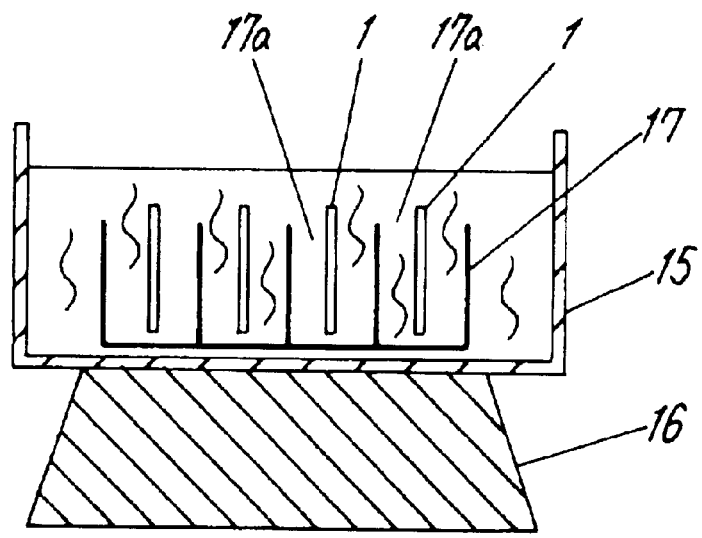

After the surface of substrate 1 is roughened by sand blasting treatment, it is preferred to clean the substrate 1 by means of ultrasonic cleaning, as shown in FIG. 18. Provided at the bottom of a liquid vessel 15 is an ultrasonic oscillation element 16. Inside the liquid vessel 15, a container 17 made of wire frame is provided and a substrate 1 is placed flutterable in an individual storage sector 17a of the container 17. The vessel 15 is filled with a liquid containing no oxygen, for example, alcohol. By the ultrasonic cleaning the abrasives and chip dusts are removed from the surface of substrate 1. Further, as the ultrasonic cleaning is performed with a liquid containing no oxygen, the surface of connecting area 4a of conductive pattern 4 is least oxidized, which contributes to suppress the occurrence of connection trouble between the connecting area 4a and the protruding electrode 7a of IC 7 due to surface oxidation. When alcohol is used for the liquid, drying treatments after cleaning are easy because of its high volatility.

By performing the ultrasonic cleaning with a plurality of substrates 1 disposed in the upright position in a container 17, as shown in FIG. 18, a number of substrates 1 may be cleaned at once. As a substrate 1 is disposed standing upright the abrasives and chip dusts fall under the substrate 1, and a high cleaning effect is obtainable. As a substrate 1 is disposed flutterable in the individual storage sector 17*a* of container 17, the substrate 1 flutters during ultrasonic cleaning procedure to yield a still higher cleaning effect.

It is preferred to blow a substrate 1, after being cleaned, with a gas containing least oxygen. By the gas blowing, substrate 1 dries up quickly, and oxidation of the surface of connecting area 4*a* is suppressed. Further, it is preferred that substrates 1 after drying are stored in an ambient free from the atmospheric air. By so doing, the surface of connecting area 4*a* under the storage may be prevented from getting materially oxidized. This contributes to eliminate a connection trouble with the protruding electrode 7*a* of IC 7 that might occur in a subsequent process step.

Although the present invention has been described in terms of the presently preferred embodiments, it is to be understood that such disclosure is not to be interpreted as limiting. Various alterations and modifications will no doubt become apparent; for example, a circuit component comprised of a hybrid integrated circuit containing a semiconductor IC may be mounted, as the electronic component, on an invented electronic component unit, in place of a semiconductor IC exemplified for the electronic component in the above embodiments. Accordingly, it is intended that the appended claims be interpreted as covering all alterations and modifications as fall within the true spirit and scope of the invention.

What is claimed is:

1. A method of manufacturing an electronic component unit comprising the steps of:
    forming a conductive pattern on a surface of a substrate;
    roughening a surface of a connecting area of said conductive pattern;
    printing an electroconductive adhesive on said connecting area;
    connecting an electrode of an electronic component to said electroconductive adhesive on said connecting area; and
    drying said adhesive at a temperature of 50–120° C.

2. The method of manufacturing an electronic component unit recited in claim 1, further comprising a step of testing the conductivity of said conductive pattern by pressing an electroconductive rubber piece for a conductivity test to make contact with said surface of a connecting area, said step of testing the conductivity being carried out prior to said step of roughening.

3. The method of manufacturing an electronic component unit recited in claim 2, wherein said conductive pattern is formed by a printing process, and said surface of a connecting area is roughened by means of a sand blasting treatment.

4. The method of manufacturing an electronic component unit recited in claim 3, further comprising a step of covering the surface other than said connecting area with a glass film, and a surface of said glass film is roughened in a same process step for roughening said surface of said connecting area.

5. The method of manufacturing an electronic component unit recited in claim 3, wherein said surface on which said conductive pattern is formed is roughened in a same process step for roughening said surface of said connecting area.

6. The method of manufacturing an electronic component unit recited in claim 5, further comprising a step of injecting a sealing resin between said electronic component and said substrate after said step of connecting said electrode.

7. The method of manufacturing an electronic component unit recited in claim 5, further comprising the steps of:
    covering said conductive pattern facing to a bottom surface of said electronic component with a glass film;
    roughening a surface of said glass film; and
    injecting a sealing resin between said electronic component and said substrate after said step of roughening said surface of said glass film.

8. The method of manufacturing an electronic component unit recited in claim 3, wherein a mark for location detection is formed on a surface of said substrate, and a surface of said mark for location detection is roughened in a same process step for roughening said surface of said connecting area.

9. The method of manufacturing an electronic component unit recited in claim 3, wherein an outer circumferential surface of said substrate is roughened in a same process step for roughening said connecting area.

10. The method of manufacturing an electronic component unit recited in claim 9, wherein said substrate is provided out of a large-size substrate having a groove for separation by separating said large-size substrate along said groove.

11. The method of manufacturing an electronic component unit recited in claim 10, wherein roughening the surface of the connecting area is performed by first forming a sort of substrate cluster comprising a plurality of said substrates disposed in a straight line arrangement on a plate, and then blasting abrasives from a nozzle against said substrates after said sort of substrate cluster is regulated in a position at both ends in a length direction with a guide member.

12. The method of manufacturing an electronic component unit recited in claim 11, further comprising a step of blowing the roughened surface of said substrate with a gas after roughening the surface of the connecting area.

13. The method of manufacturing an electronic component unit recited in claim 11, wherein said plate is reversed upside down so as said substrate is disposed to the bottom of the plate, and said substrate is roughened with abrasives blasted upward from said nozzle located under said substrate.

14. The method of manufacturing an electronic component unit recited in claim 11, wherein said nozzle has an opening which is larger than a width of said substrate.

15. The method of manufacturing an electronic component unit recited in claim 11, wherein said plate is rotated after being swept by said nozzle, and said plate is swept again by said nozzle.

16. The method of manufacturing an electronic component unit recited in claim 15, wherein the angle of rotation of said plate is approximately 90 degrees.

17. The method of manufacturing an electronic component unit recited in claim 11, wherein roughening the surface of the connecting area is performed by blasting first abrasives of large grain diameter against said substrate, and then blasting second abrasives of smaller grain diameter than that of said first abrasives against than said substrate from said nozzle.

18. The method of manufacturing an electronic component unit recited in claim 10, wherein roughening the surface of the connecting area is performed by first sticking said substrate on a plate with a tape, and then blasting abrasives from a nozzle against said substrate.

19. The method of manufacturing an electronic component unit recited in claim 18, wherein the width of said tape is smaller than that of said substrate.

20. The method of manufacturing an electronic component unit recited in claim 19, wherein said tape has a predetermined length and a plurality of said substrates is stuck on said tape with a predetermined clearance in the length direction between each other.

21. The method of manufacturing an electronic component unit recited in claim 18, wherein a plurality of said substrates is stuck with a predetermined clearance between each other and roughening the surface of the connecting area is performed by sweeping a nozzle over said substrates.

22. The method of manufacturing an electronic component unit recited in claim 21, wherein said nozzle sweeps over said plate in a rectangular wave form.

23. The method of manufacturing an electronic component unit recited in claim 22, wherein said nozzle sweeps for plural times.

24. The method of manufacturing an electronic component unit recited in claim 23, wherein said nozzle sweeps in a second sweep along a track that is different from that in a first sweep.

25. The method of manufacturing an electronic component unit recited in claim 22, wherein said nozzle sweeps in a coming and going motion.

26. The method of manufacturing an electronic component unit recited in claim 25, wherein said nozzle in the coming sweep takes a track which is different from that in the going sweep.

27. The method of manufacturing an electronic component unit recited in claim 9, wherein said substrate after roughening the surface of the connecting area is cleaned by means of ultrasonic cleaning in a liquid containing no oxygen.

28. The method of manufacturing an electronic component unit recited in claim 27, wherein said liquid is alcohol.

29. The method of manufacturing an electronic component unit recited in claim 28, wherein a plurality of said substrates is housed in a container in an upright position to be immersed altogether into said liquid.

30. The method of manufacturing an electronic component unit recited in claim 29, wherein each of said plurality of said substrates is housed flutterable in an individual storage space of said container.

31. The method of manufacturing an electronic component unit recited in claim 27, wherein said substrate after being pulled out of said liquid is blown with a gas containing least oxygen.

32. The method of manufacturing an electronic component unit recited in claim 31, wherein said substrate after being blown with the gas is stored for a time period in an ambience free from the atmospheric air.

33. The method of manufacturing an electronic component unit recited in claim 1, wherein said conductive pattern is formed by a thick-film printing process, and said surface of said connecting area is roughened by means of dry etching treatment.

34. The method of manufacturing an electronic component unit recited in claim 18, wherein the outer diameter of said tape is smaller than that of said substrate.

* * * * *